(12) United States Patent
Iwabuchi et al.

(10) Patent No.: US 7,688,049 B2
(45) Date of Patent: Mar. 30, 2010

(54) LEVEL SHIFT CIRCUIT AND POWER SUPPLY DEVICE

(75) Inventors: Akio Iwabuchi, Niiza (JP); Tetsuya Takahashi, Niiza (JP)

(73) Assignee: Sanken Electric Co., Ltd., Niiza-shi (JP)

(*) Notice: Subject to any disclaimer, the term of this patent is extended or adjusted under 35 U.S.C. 154(b) by 180 days.

(21) Appl. No.: 11/909,525

(22) PCT Filed: Mar. 22, 2006

(86) PCT No.: PCT/JP2006/305732

§ 371 (c)(1),
(2), (4) Date: Mar. 21, 2008

(87) PCT Pub. No.: WO2006/101139

PCT Pub. Date: Sep. 28, 2006

(65) Prior Publication Data

US 2009/0052216 A1    Feb. 26, 2009

(30) Foreign Application Priority Data

Mar. 23, 2005  (JP) .............................. 2005-084132

(51) Int. Cl.
*G05F 1/40* (2006.01)
*H03K 19/0175* (2006.01)

(52) U.S. Cl. .......................... 323/271; 326/80

(58) Field of Classification Search ................. 323/223, 323/225, 268, 271, 282, 288, 349–351; 326/63, 326/68, 80–84
See application file for complete search history.

(56) References Cited

U.S. PATENT DOCUMENTS

| | | | | |
|---|---|---|---|---|
| 4,989,127 A | * | 1/1991 | Wegener | 363/16 |
| 5,212,474 A | * | 5/1993 | Muhlemann | 345/208 |
| 5,444,396 A | * | 8/1995 | Soneda | 326/81 |
| 5,963,066 A | | 10/1999 | Fukunaga | |
| 6,529,061 B1 | | 3/2003 | Orita | |
| 7,538,583 B2 | * | 5/2009 | Bryson | 326/88 |
| 2009/0134930 A1 | * | 5/2009 | Tamura | 327/333 |

FOREIGN PATENT DOCUMENTS

| | | |
|---|---|---|
| JP | 7-297698 | 11/1995 |
| JP | 10-285949 | 10/1998 |
| JP | 2000-286687 | 10/2000 |
| JP | 2002-314351 | 10/2002 |
| JP | 2003-133927 | 5/2003 |

* cited by examiner

*Primary Examiner*—Matthew V Nguyen
(74) *Attorney, Agent, or Firm*—Oblon, Spivak, McClelland, Maier & Neustadt, L.L.P.

(57) ABSTRACT

In a level shift circuit including: an inverter circuit having a series circuit of a Pch-type transistor and an Nch-type transistor, which re connected between electrodes of a floating power supply; and a transistor Q1 in which a drain terminal and a source terminal are connected between an input terminal of the inverter circuit and a ground, wherein a drain terminal and source terminal of a transistor Q2 are connected between one terminal of the floating power supply and the drain of the transistor Q1, and a drain terminal and source terminal of a transistor Q3 are connected between a control terminal of the transistor Q2 and the ground.

11 Claims, 11 Drawing Sheets

LEVEL SHIFT CIRCUIT AND POWER SUPPLY DEVICE

TECHNICAL FIELD

The present invention relates to a level shift circuit for use in a half bridge gate driver, a full bridge gate driver, and a three-phase bridge gate driver, which are of a bootstrap mode, and further to a power supply device using the same.

BACKGROUND ART

In a drive circuit of a high voltage power element, a level shift circuit that transmits a low voltage logic signal to a gate control portion of a high side output element is indispensable. Heretofore, for this type of level shift circuit, a mode of transmitting the signal by using a high voltage MOSFET has been used.

First Conventional Technology

As an example of this circuit, a half bridge drive circuit 101 as shown in FIG. 1 has been known. This drive circuit 101 is to alternately input a high side drive signal and a low side drive signal, and to alternately turn ON/OFF high side and low side high voltage power elements Q13 and Q14.

In the drive circuit 101, a bootstrap structure having a floating potential Vss is adopted, whereby a potential difference that occurs between a high side power supply line VBS and a floating potential Vss is always varied by a constant potential difference. Accordingly, it becomes unnecessary that elements connected between the Vss and the VBS withstand high voltage. Therefore, though the drive circuit 101 is a high-voltage IC, it is not necessary to form all the elements thereof as high voltage ones.

It is noted that a level shift circuit 103 shown in FIG. 1 is a circuit shared also in the case of performing an ON control for a high side driver 11 and performing an OFF control for the high side driver 11. A control circuit that does not have a level shift function is connected to an input end of a low side driver 13. Moreover, there has been known a level shift circuit that, in order to suppress a current consumption, detects a logic change point of an input signal, perform level shift, and flows a current only through the logic change point.

With reference to FIG. 2, a description will be made of an operation of a drive circuit using the level shift circuit 103 as described above. FIG. 2 is a timing chart showing an operation of the high side.

In this drive circuit 101, when the high side drive signal rises to an "H" level (time t1), an edge detection circuit (not shown) generates an ON pulse in accordance with a rising edge of the high side drive signal (t2). This ON pulse is inputted to a gate VG (ON) of a high voltage N-type MOS transistor Q1 of the level shift circuit 103 for use in performing such an ON/OFF control for the high side, and this N-type MOS transistor Q1 turns to a conduction state. In such a way, a current I supplied from the high side power supply line VBS passing through a pull-up resistor R1 to a ground end GND on the low side. By this current I, a potential difference V occurs between both ends of the resistor P1, and an input end Vin (ON) of a signal inverter circuit 105 drops to an "L" level.

At this time, when a source resistance of the high voltage N-type MOB transistor Q1 is defined as RS1, and a value of the pull-up resistor is defined as R1, the following relational expression is established.

$$V = I \times R1 = (VG - Vth)/RS1 \times R1 \quad (1)$$

In such a way, a pulse signal of the "H" (high) level is outputted as an output Vout signal from the inverter circuit 105, and a pulse signal of a level of a VBS voltage as a high side power supply line voltage is inputted to an ON/OFF input end of the high side driver 11 As a result, a high side IGBT (Q13) turns to a drive state by a latch circuit of a high side drive circuit, and the floating potential Vss rises to a predetermined potential (usually, approximately 600V) (t4).

When the high side drive signal drops to the "L" (low) level after the floating potential Vss sufficiently rises to the predetermined potential (t5), the edge detection circuit (not shown) generates such an ON/OFF pulse signal again in accordance with a falling edge of the high side drive signal (t6). This ON/OFF pulse signal is inputted to the gate of the transistor Q1 of the level shift circuit 103, and this N-type MOS transistor turns to the conduction state. In such a way, the pulse signal of the level of the high side power supply line VBS voltage is inputted to the ON/OFF input end of the high side driver 11 in a similar way to the case of the ON pulse signal, and the drive state of the high side IGBT (Q13) is released by the latch circuit of the high side drive circuit (t7).

Second Conventional Technology

A half bridge drive circuit 11 as shown in FIG. 3 has been reported in Japanese Patent Laid-en Publication No. 2000-286687. A level shift circuit 113 provided in this drive circuit 111 is one in which, to the pull-up resistor R1 of the level shift circuit 103 shown in FIG. 1, a transistor Q2 for short-circuiting both ends thereof is connected.

Not only such an ON input of the high side driver is shown in the level shift circuit 113 shown in FIG. 3, but a circuit similar to the level shift circuit 113 is also connected to an OFF input thereof.

With reference to FIG. 3, an operation of the drive circuit 111 using the level shift circuit 113 as described above will be described. FIG. 4 is a timing chat showing an operation of the high side.

Here, VG1 is a gate input of the N-type MOS transistor Q1, VG2 is a gate input of the P-type MOS transistor Q2, (ON) represents the level shift circuit on the ON side of the high side, and (OFF) represents the level shift circuit on the OFF side of the high side. In an initial state, a gate VG2 (ON) is set at the "H" level, and a gate VG2 (OFF) is set at the "L" level.

When the high side drive signal rises to the "H" level (t1), the edge detection circuit (not shown) generates the ON pulse signal in accordance with the rising edge of the high side drive signal (t2). This ON pulse signal is inputted to a gate VG1 (ON) of the high voltage N-type MOS transistor Q1 of the ON-side level shift circuit 113, and this N-type MOS transistor Q1 turns to the conduction state.

At this time, the gate VG2 (ON) is at the "H" level, and the P-type MOS transistor Q2 is in an OFF state, and accordingly, an output potential Vin thereof is set at the "L" level, and an output Vout of the inverter circuit 105 is set at the "H" level Hence, an ON signal is inputted to an ON input end of the high side driver 11, whereby an output of the latch circuit provided inside thereof is inverted. Then, an input VH of the IGBT (Q13) on the high side rises to the "H" level by the high side driver 11, and the IGBT (Q13) is driven to be ON.

Upon receiving the ON pulse signal, the gate VG2 (ON) of the P-type MOS transistor Q2 drops to the "L" level after an elapse of Δt, whereby the P-type MOS transistor Q2 turns to an ON state (t4). At this time, an ON resistance Ron is designed to be sufficiently small so that an ON resistance RonQ2 of the P-type MOS transistor Q2 can maintain Vin that does not exceed a threshold voltage of the inverter circuit 105 even if the current I flowing through the N-type MOS transistor Q1 flows through the P-type MOS transistor Q2 Accordingly, the output potential Vin concerned maintains the "H" level.

In a similar manner, the gate VG2 (OFF) is set at the "L" level, and the P-type MOS transistor Q2 of the OFF-side level shift circuit is also in the ON state. Accordingly, the output potential Vin of the P-type MOS transistor Q2 is fixed at the high side power supply line VBS. Thus, even if a potential of the floating potential Vss rises by thereafter turning ON the IGBT (Q13) on the high side, and a displacement current owing to a parasitic capacitor C1 for the N-type MOS transistor Q1 is generated, the outputs of the ON- and OFF-side level shift circuits are not varied, and thus a malfunction can be prevented.

After the IGBT (Q13) is completely turned ON (t5), and the displacement current is extinguished, the gate VG2 (OFF) of the OFF-side P-type MOS transistor rises to the "H" level (t6) At this time, a time difference Δt2 since the latch circuit is inverted is in a relationship of Δt2>Δt1 in comparison with Δt1.

When the high side drive signal drops to the "L" level (t7), the edge detection circuit (not shown) generates an OFF pulse in accordance with the falling of the high side drive signal (t8). This OFF pulse is inputted to a gate VG1 (OFF) of the high voltage N-type MOS transistor Q1 of the OFF-side level shift circuit, and this N-type MOS transistor Q1 turns to the conduction state. At this time, since the gate VG2 (OFF) is at the "H" level, and the P-type MOS transistor Q2 is in the OFF state, the output potential Vin thereof drops to the "L" level, and the output Vout of the inverter circuit 105 rises to the "H" level. Hence, an OFF signal is inputted to an OFF input end of the high side driver 11, whereby the output of the latch circuit provided inside thereof is inverted. Then, the input VH of the IGBT (Q13) on the high side drops to the "L" level by the high side driver 11, and the IGBT (Q13) is turned OFF.

Upon receiving the OFF pulse signal, the gate VG2 (OFF) of the P-type MOS transistor Q2 drops again to the "L" level after the elapse of Δt, whereby the P-type MOS transistor Q2 turns to the ON state (t10) Hence, in a similar manner to the tire of transmitting the ON signal, the IGBT (Q13) is turned OFF, whereby the potential of the floating potential Vss drops. Accordingly, even if a displacement current due to a parasitic capacitor existing at the N-type MOS transistor (Q13) is generated, the outputs of the ON-side and OFF-side level shift circuits are not varied, and accordingly, the malfunction can he prevented.

As described above, the pull-up resistor R1 and the P-type MOS transistor Q2 are controlled to be OFF when the N-type MOS transistor Q1 for use in the level shift is turned ON, and to be ON when the floating potential Vss is changed Accordingly, the pull-up resistor R1 can be increased at the time of transmitting the signal, and the Q2 placed parallel to the pull-up resistor R1 is turned ON while the displacement current due to variations of an intermediate potential is being generated.

DISCLOSURE OF THE INVENTION

Problems to be Solved by the Invention (Problem of First Conventional Technology)

As described a in the level shift circuit 103 of the first conventional technology, as shown in FIG. 2, when the high side drive signal rises to the "H" level (t1), the edge detection circuit (not shown) generates the ON/OFF pulse signal in accordance with the rising of the high side drive signal (t2). This ON pulse signal is inputted to the gate VG of the high voltage N-type MOS transistor Q1 of the ON-side level shift circuit 103, and this N-type MOS transistor Q1 turns to the conduction state. Subsequently, the "L" level is inputted to the gate VG, and this N-type MOS transistor Q1 turns to the OFF state.

However, after the transistor Q1 is switched from the conduction state to the OFF state, that is, in a process in which a potential of an point A that serves as an input terminal of the signal level detection circuit 103 shifts from the "L" level to the "H" level, the relatively large parasitic capacitor C1 exists existing at the high voltage transistor Q1 that has turned to the OFF state.

Therefore, as shown in FIG. 5, when the output potential Vss rises from the "L level" to the "H" level at a high speed (t3 to t4), the charging current I to the parasitic capacitor C1 flows through the pull-up resistor R1 and a Zener diode ZD1, and after the rise of the potential Vss stops (t4 and after), the drain potential Vin of the transistor Q1 continues to rise in accordance with a time constant τR1 by the pull-up resistor R1 and the parasitic capacitor C1.

As a result, for a period from the time t1 to the time t5, a mask time TM2 occurs, during which preparation for transmitting the next level shift signal to the VG1 is not made, that is, during which the signal transmission is not made. Accordingly, it is desired that this mask time be shortened in order to transit the signal to the level shift circuit 103 at a high speed and to operate the level shift circuit 103.

In order to solve this, for example, in the half bridge drive circuit 101 shown in FIG. 1, the pull-up resistor R1 just needs to be made small in order to realize the signal transmission in a short time. It is noted that the parasitic capacitor C1 is a parasitic capacitor existing at the high voltage transistor Q1, which is large-sized for withstanding high voltage, and the parasitic capacity C1 cannot be easily made small.

However, when the resistance of the pull-up resistor for transmitting the level shift signal to the VG1 is reduced, it is necessary to flow, through the transistor Q1, the large current I following the decrease in the resistance R1 in order to maintain the sane potential difference between the terminals of the pull-up resistor R1 as that before change in resistance. And there has been a problem that a power consumption of the transistor Q1 to which the high voltage is applied is increased. As a result, in the first conventional technology, it has been impossible to suppress the power consumption, and to realize the high-speed operation.

(Problem of Second Conventional Technology)

Moreover, in the above-described second conventional technology, as shown in FIG. 3, there is also considered an attempt to prevent the malfunction and realize the high-speed operation in such a manner that the P-type MOS transistor Q2 is connected in parallel to both ends of the pull-up resistor R1, and that a timing signal is inputted to the gate VG2 of this P-type MOS transistor Q2.

However, in terms of the optimum timing of the timing signal inputted to the gate VG2 which is for operating this P-type MOS transistor Q2, since the rising speed of the potential of the high side driver 11 is varied according to a load and a Power element, the P-type MOS transistor Q2 cannot help but being operated by a timer while assuming the case where such a variation is the largest, and actually, a large effect for the speed enhancement cannot be brought.

Moreover, though no problem occurs in the case where the timing signal of the P-type MOS transistor Q2 is generated in the high side driver 11 by the timer set at a fixed time, a high voltage level shift circuit must be used in order to drive the P-type MOS transistor Q2 by the timing signal from the low side driver 13. As a result, there has been a problem that the power consumption of the circuit operated by the timing signal inputted to the gate VG1 is increased.

The present invention has been made in consideration for the above description. In accordance with the present invention, there can be provided a level shift circuit and a power supply device, which are capable of suppressing the power consumption and realizing the high-speed operation by using a simple circuit configuration.

MEANS FOR SOLVING THE PROBLEM

According to a first technical aspect of the present invention, a level shift circuit, comprises: a floating power supply; a signal detection circuit connected to one end of the floating power supply; a signal level detection circuit connected between electrodes of the floating power supply and connected to an output of the signal detection circuit, and a first switching element for performing level shift, in which a pair of gain terminals thereof are individually connected between an input terminal of the signal detection circuit and a ground, characterized in that, in the signal detection circuit and the signal level detection circuit, a second switching element is connected to the signal detection circuit, and a second capacitor element having a time constant corresponding to a time constant defined based on a parasitic capacitor existing between the main terminals of the first switching element is connected to a control terminal of the second switching element.

In accordance with a second technical aspect of the present invention, the level shift circuit is further characterized in that, when a current flows through the second capacitor element, the second switching element switches the time constant, that is defined based on the parasitic capacitor existing between the main terminals of the first switching element and on the signal detection circuit, to a smaller time constant.

In accordance with a third technical aspect of the present invention, in addition to the first technical aspect, the level shift circuit is characterized in that the second capacitor is a parasitic capacitor existing at a third transistor in which a pair of main terminals are connected between the control terminal of the second switching element and the ground.

In accordance with a fourth technical aspect of the present invention, in addition to the first technical aspect, the level shift circuit is characterized in that the second capacitor is a parasitic capacitor existing at a rectifier element in which a pair of main terminals are connected between the control terminal of the second switching element and the ground.

In accordance with a fifth technical aspect of the present invention, in addition to the first technical aspect, the level shift circuit is characterized in that a resistor element is connected between the control terminal of the second switching element and one terminal of the floating power supply.

In accordance with a sixth technical aspect of the present invention, in addition to the first technical aspect, the level shift circuit is characterized in that a voltage suppression element is connected between the floating power supply and an input terminal of the signal level detection circuit or/and the control terminal of the second switching element.

In accordance with a seventh technical aspect of the present invention, in addition to the first technical aspect, the level shift circuit is a power supply device including a high side driver for driving a high side transistor, and a low side driver for driving a low side driver, characterized in that the level shift circuit is employed as a circuit for inputting a control signal to the high side drivers.

BEST MODE FOR CARRYING OUT THE INVENTION

A best mode for carrying out a power supply device using a level shift circuit according to the present invention will be described below with reference to the drawings.

First Embodiment

Figure 6:
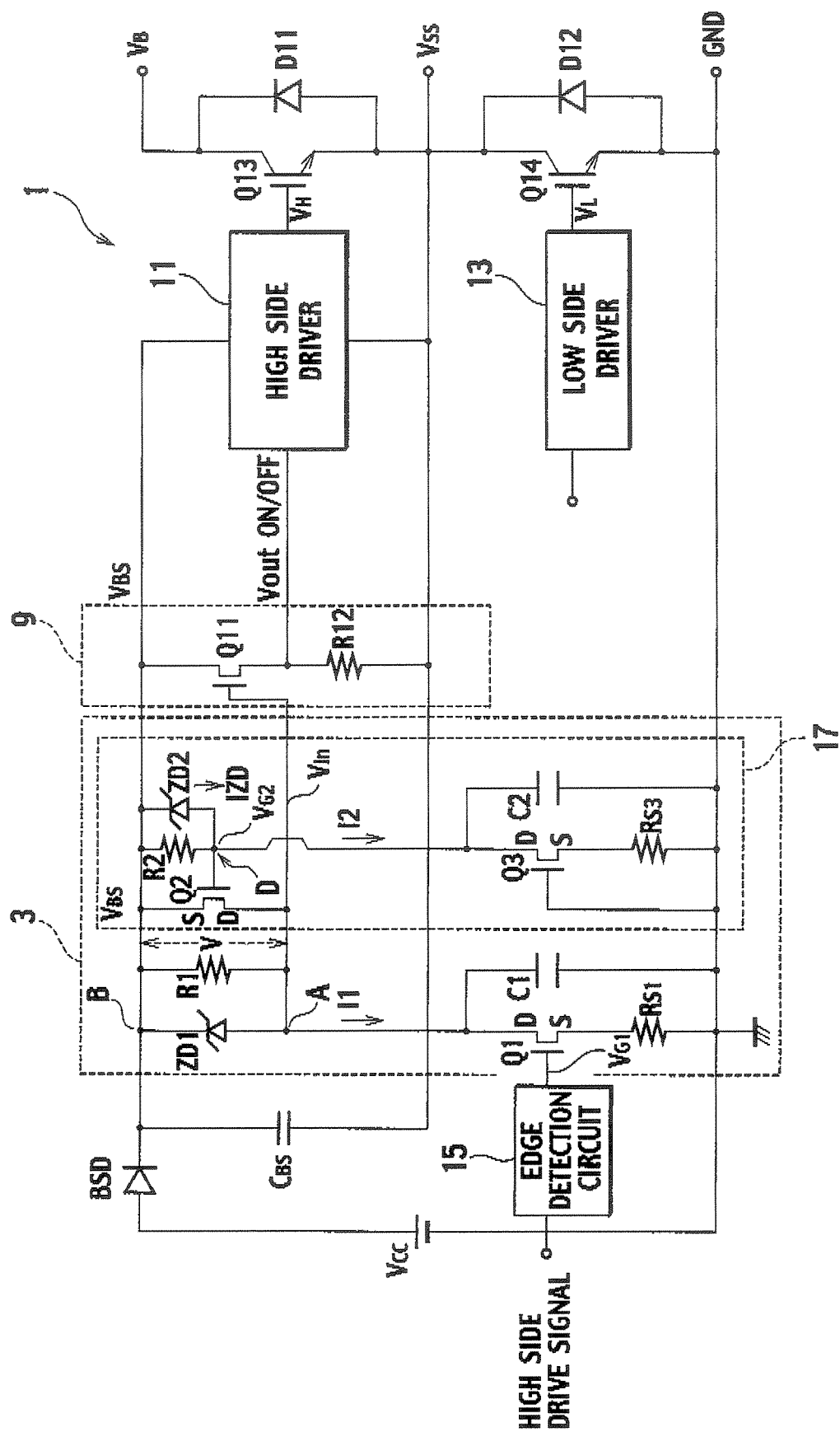
FIG. 6 is a diagram showing a drive circuit using a level shift circuit according to a first embodiment of the present invention.

FIG. 6 is a diagram showing a drive circuit 1 using a level shift circuit according to a first embodiment of the present invention. As shown in FIG. 6, a negative pole of a direct current power supply Vcc is grounded to a GND, a positive pole thereof is connected to an anode of a diode BSD, and a cathode of the diode BSD forms a high side power supply line VBS.

To this high side power supply line VBS, one end of a bootstrapping capacitor CBS as a floating power supply is connected, and the other end of the floating power supply CBS is connected to an end of a floating potential Vss.

A high side driver 11 is connected between an end of the bootstrapped potential VBS and an end of the floating potential Vss. By this driver 11, an IGBT (Q13) on a high side, which is connected between a power supply VB and the floating potential Vss, is driven. The Q13 is described by using the IGBT in this embodiment, however, a switching element such as a MOS-type or bipolar power transistor may also be employed.

An IGBT (Q14) on a low side is connected between an end of the ground potential GND and the end of the floating potential Vss, and this IGBT (Q14) is driven by a low side driver 13.

A level shift circuit 3 (region surrounded by a dotted line in the drawing) for providing a signal to an ON/OFF input end of this high side driver 11 is configured in the following manner.

A signal level detection circuit 9 is connected between electrodes of the floating power supply, that is, between the VBS end and the end of the floating potential Vss. A P-type MOS transistor Q2 is connected between an input end of this signal level detection circuit 9 and the VBS end. A high voltage N-type MOS transistor Q1 for use in level shift is connected between the input end of the signal level detection circuit 9 and a GND end.

The P-type MOS transistor Q2 is connected between the VBS end on one side of the floating power supply and a drain of the transistor Q1 for use in the level shifts and a transistor Q3 is connected between a control terminal of the transistor Q2 and the ground. This transistor Q3 allows a gate terminal thereof to be connected to the GND performing an OFF control for this transistor, whereby a capacitor element equivalent to a capacitor C2 is for. It is noted that the capacitor C1 is nearly equal to the capacitor C2.

Between the control terminal of the transistor Q2 and the VBS terminal on one side of the floating power supply, a pull-up resistor R2 is connected, and further, a Zener diode ZD2 that composes a voltage suppression element is connected. Moreover, between the input terminal of the signal level detection circuit 9 and the floating power supply VBS, a Zener diode ZD1 that composes a voltage suppression element is connected, and a resistor R1 is connected in parallel thereto.

A high side drive signal is inputted to an edge detection circuit 15, and the edge detection circuit 15 detects a rising edge and falling edge of this signal, generates a level shift signal VG1 with a predetermined pulse width, and inputs the level shift signal VG1 to a gate of the transistor Q1.

Moreover, a control circuit that does not have a level shift function is connected to an input end of the low side driver 13.

Figure 1:
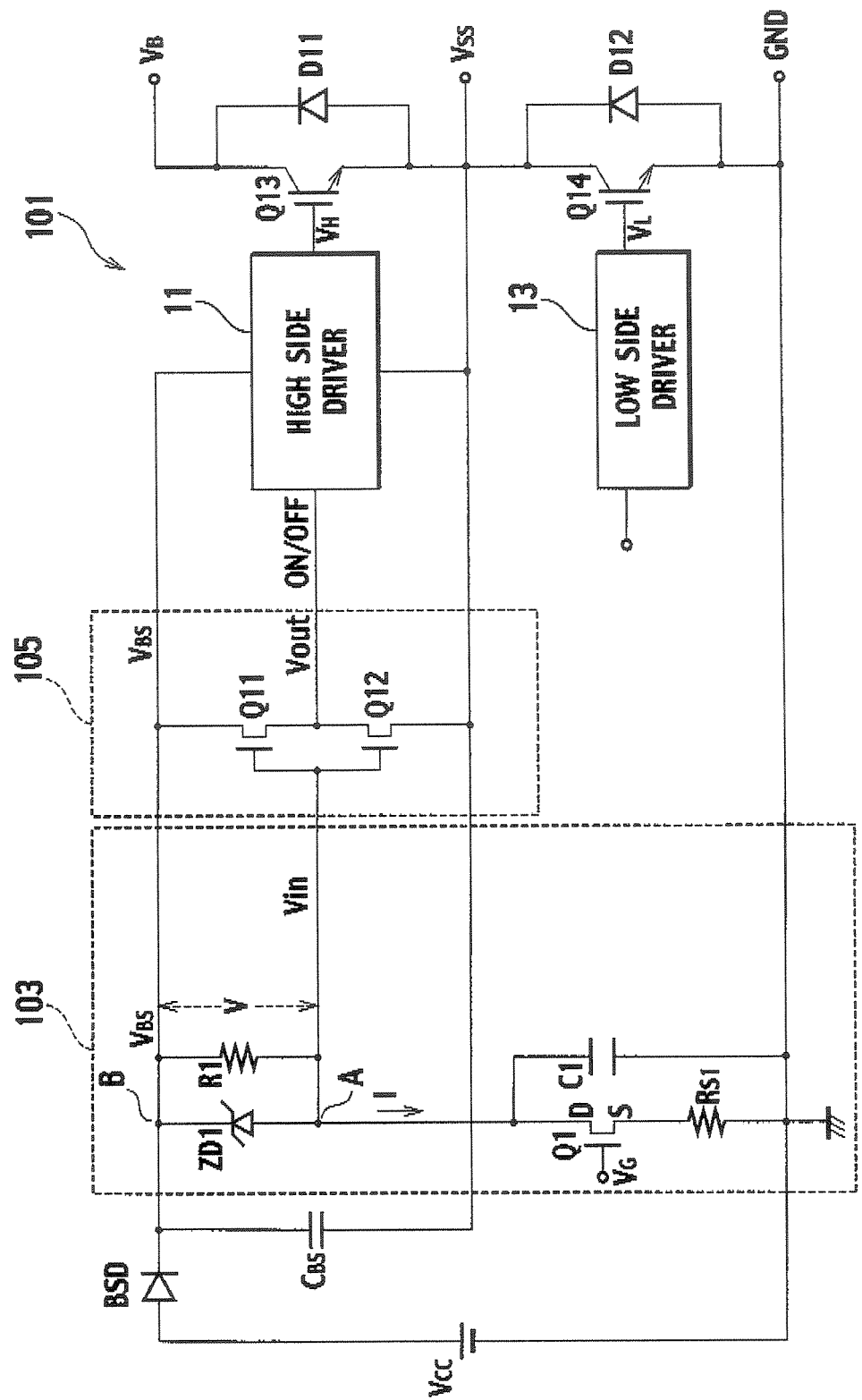
FIG. 1 is a diagram showing a half bridge drive circuit 101 as a first conventional technology.
Figure 2:
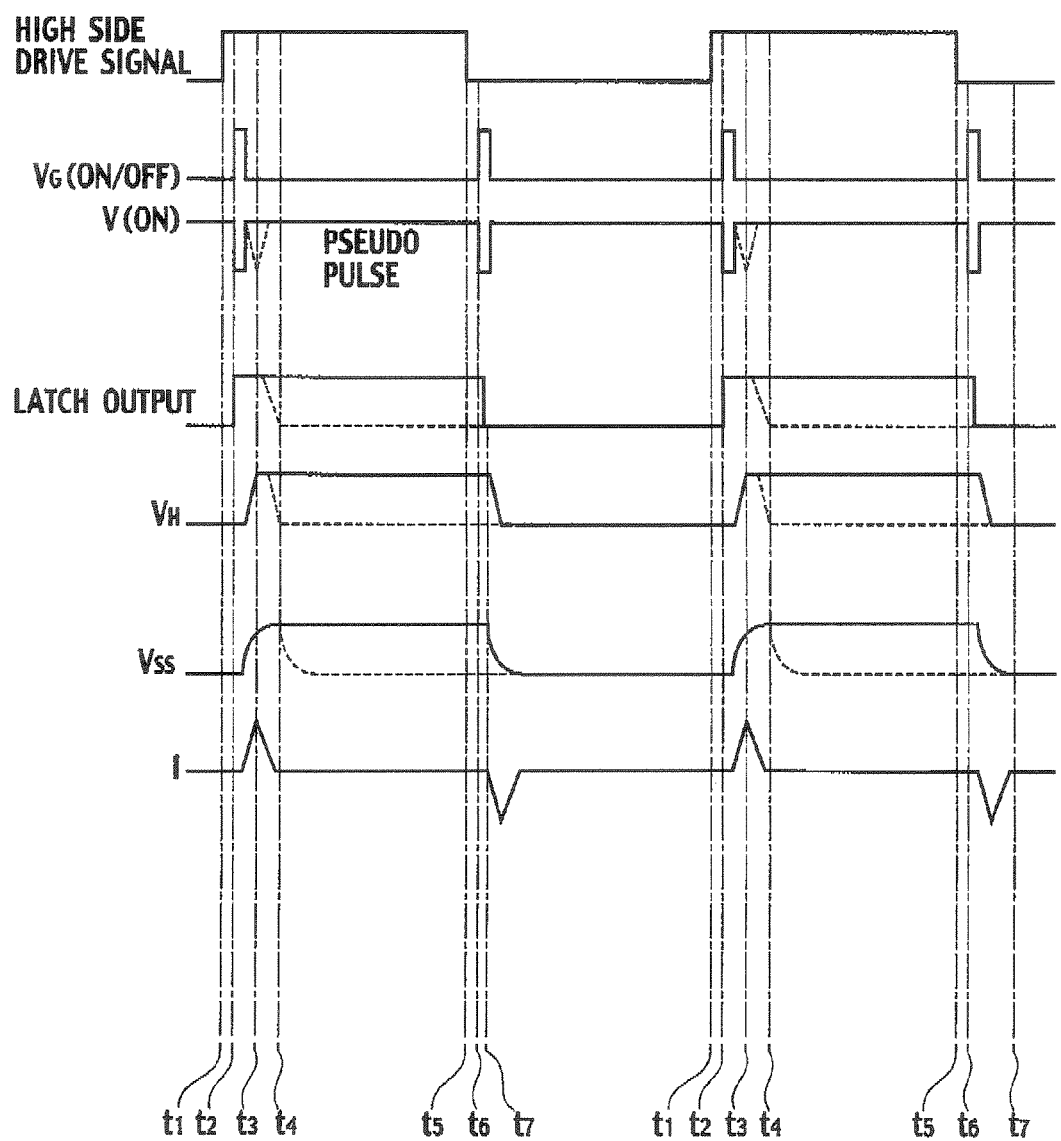
FIG. 2 is a timing chart for explaining an overall operation of the half bridge drive circuit 101 as the first conventional technology.

A feature of the level shift circuit 3 shown in FIG. 6 is in that, to the conventional level shift circuit 103 shown in FIG. 1, there is added an emphasis circuit 17 that interconnects the transistor Q3 with the same structure as the transistor Q1 composed of a MOSFET for use in the level shift, the transistor Q2 formed of a P-type MOSFET, the pull-up resistor R2, and the Zener diode ZD2.

A time constant τR1 is defined based on the parasitic capacitor C1 as a parasitic element of the transistor Q1 and the pull-up resistor R1 and a time constant τR2 is defined based on the parasitic capacitor C2 as a parasitic element of the transistor Q3 and the pull-up resistor R2. The time constants have a relationship of: τR2<τR1. Moreover, a time constant τR3 defined based on the parasitic capacitor C1 as a parasitic element of the transistor Q1, the pull-up resistor R1 and an ON resistance Ron of the transistor Q2 and the tie constant τR2 have the following relationship:

$$\tau R3 < \tau R2 \quad (2)$$

Specifically, the pull-up resistors R1 and R2 and the ON resistance Ron of the transistor Q2 are selected so that the time constant τR2 can be somewhat larger than the time constant τR3.

(Overall Operation)

Figure 7:
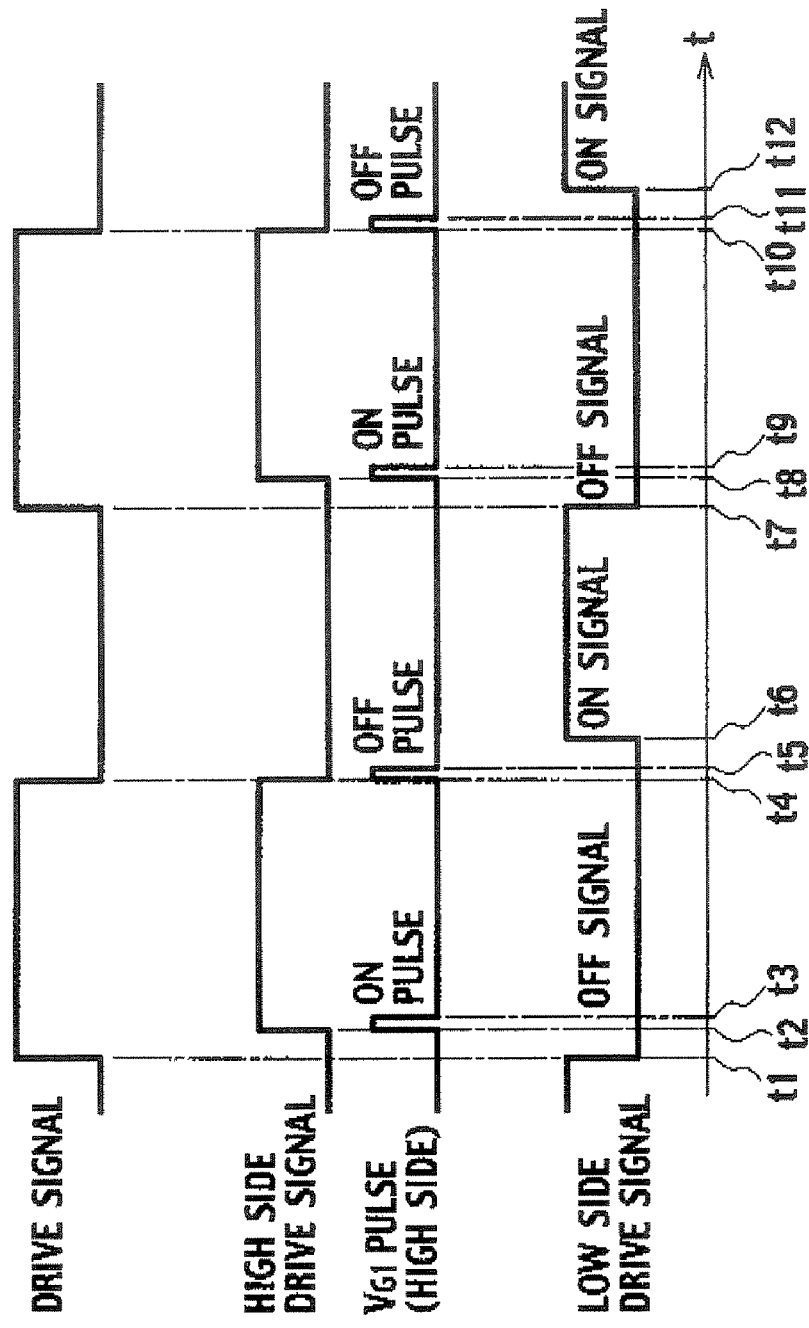
FIG. 7 is a taming chart to show an overall operation of a drive circuit 1 using a level shift circuit 3.

With reference to FIG. 7, a description will be made of an overall operation of the drive circuit 1 using the level shift circuit 3 as described above. Note that FIG. 7 is a timing chart showing an operation of the high side.

Here, the level shift signal VG1 is the high side drive signal outputted from the edge detection circuit 15 to the N-type MOS transistor Q1, and a pulse signal for performing an ON/OFF control for the high side driver 11 is inputted to the level sift circuit 3.

When the high side drive signal rises from the "L" level to the "H" level (t2), the edge detection circuit 15 generates the level shift signal VG1 as an ON pulse signal in accordance with the rise of the high side drive signal.

This level shift signal VG1 is inputted to a gate VG1 (ON) of the high voltage N-type MOS transistor Q1 of the level shift circuit 3, and this N-type MOS transistor Q1 turns to a conduction state, At this time, a VG2 (ON) is at the "H" level, and the P-type MOS transistor Q2 is in an OFF state, and accordingly, an output potential Vin inputted to the signal level detection circuit 9 drops to the "L" level, and an output Vout of the signal level detection circuit rises to the "H" level.

Thus, an ON signal is inputted to an ON input end of the high side driver 11, whereby an output of a latch circuit provided inside thereof is inverted. Then, an input VH of the IGBT (Q13) on the high side rises to the "H" level by the high side driver 11, and the IGBT (Q13) is driven to he ON.

As shown in FIG. 7, when the high side drive signal rises to the "H" level (t2), and the edge detection circuit 15 detects the rising edge of the high side drive signal and generates the level shift signal VG1 made of the high-level pulse signal (t2 to t3), the N-type MOS transistor Q1 turns to the conduction state. As a result, a current I1 supplied from the high side power supply line VBS to the pull-up resistor R1 and the Zener diode ZD1 passes through a path extending along the drain of the transistor Q1, a source thereof, and the GND. Thus, a Vin potential of an point A that serves as the input terminal of the signal level detection circuit 9 is suppressed to a Zener potential VZD1 by the Zener diode ZD1. It is noted that the potential VBS is not applied to the drain of the transistor Q2 at this point of time, and accordingly, the transistor Q2 is in the OFF state.

By this current I1, a potential difference V occurs between both ends of the pull-up resistor R1, and an input end Vin (ON) of the signal level detection circuit 9 turns to the "L" level.

At this time, when a source resistance of the high voltage N-type MOS transistor Q1 is defined as the RS1, and a resistance of a pull-up resistor is defined as R, the above-described expression (1) is established.

In such a way, the output Vout of the signal level detection circuit 9 rises to the "H" level, the high side power supply line VBS is inputted to the ON input end of the high side driver, the high side IGBT (Q13) turns to a drive state, and the floating potential Vss rises to a potential VB (usually, approximately 600V). When the floating potential Vss rises to the highest potential VB after starting to rise, the high side power supply line VBS inputted to the ON input end of the high side driver 11 also rises gradually.

(Characteristic Operation)

Figure 8:
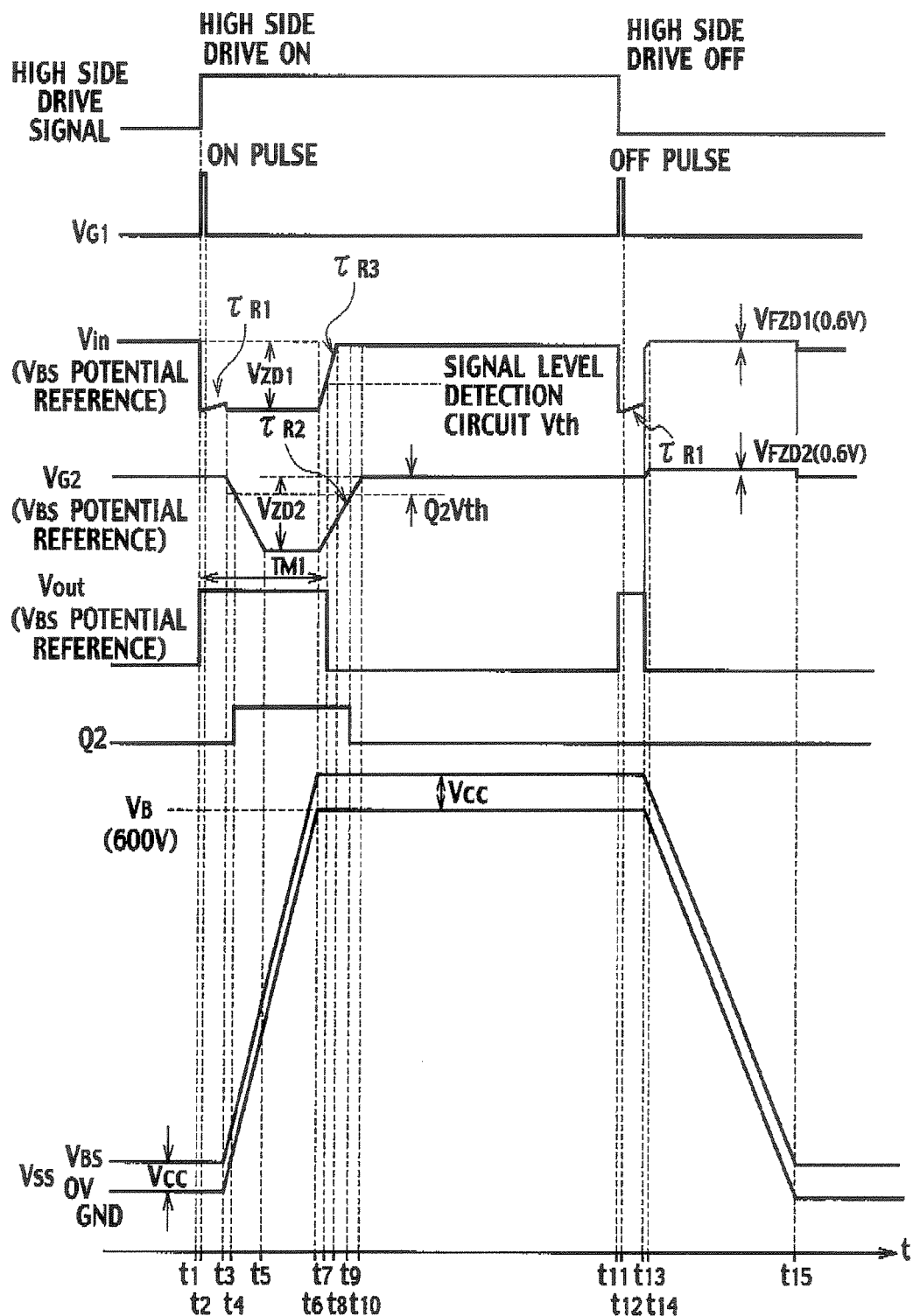
FIG. 8 is a timing chart to show a characteristic operation of the drive circuit 1 using the level shift circuit 3.

With reference to FIG. 8, a description will be made of a characteristic operation of the drive circuit 1 using the level shift circuit 3 as described above. FIG. 8 is a timing chart showing the operation of the high side.

At the time t1, when the high side drive signal rises from the "L" level to the "H" level, the edge detection circuit 15 detects the rising edge of the high side drive signal, and generates the level shift signal VG1 of the ON pulse.

At this time, the N-type MOS transistor Q1 is switched from the OFF state to the ON state, then the current I1 supplied fro the high side power supply line VBS to the pull-up resistor R1 and the Zener diode ZD1 passes through a path extending along the drain of the transistor Q1, the source thereof, the source resistance RS1, and to the GND. The Vin potential of the point A is suppressed to the Zener potential VZD1 to drop down to a threshold voltage Vth of the signal level detection circuit 9 or less, and thus the output Vout of the signal level detection circuit 9 is switched from the "L" level to the "H" level.

For a period from the time t1 to the time t2, the N-type MOS transistor Q1 is set in the ON state, and accordingly, the Vin potential of the point A is suppressed to the Zener diode potential VZD1.

For a period from the time t2 to the time t3, when the level shift signal VG1 is switched from the "H" level to the "L" level (t2), this N-type MOS transistor Q1 turns to the OFF state. At the point of time (t2) when the transistor Q1 is switched from the conduction state to the OFF state, i.e., when the transistor Q1 shifts to an open state, it is noted that a relatively large parasitic capacitor C1 exists at the transistor Q1 for use in high voltage level shift. Simultaneously, a parasitic capacitor C2 substantially equivalent to the C1 exists also at the transistor Q3.

For the period from the time t2 to the time t3, the current I1 passes through a path extending along the high side power supply line VBS, the pull-up resistor R1 and the parasitic capacitor C1, the capacitor C1 is charged, and the potential Vin of the point A gradually rises.

At the time t3, the high side power supply line VBS of the high side driver 11 starts to rise. At this time, a current I2 passes through a path extending along the high side power supply line VBS, the pull-up resistor R2, and the parasitic capacitor C2, the C2 is charged, and a potential VG2 of a point D starts to gradually drop.

At the time t4, the potential VG2 of the point D drops down to the threshold voltage Vth of the transistor Q2 or less, and the transistor Q2 is turned ON, and turns to the conduction state.

For a period from the time t4 to a time t5, the above-described current I2 flows through the parasitic capacitor C2, the C2 is charged, and the potential VG2 of the point D drops down to a Zener diode potential VZD2 of the Zener diode ZD2.

For this while, at the time t3, the potential of the high side power supply line VBS, which is applied to the high side driver 11, starts to rise, and at a time t6, the potential of the high side power supply line VBS, which is applied to the high side driver 11, stops rising.

For a period from the time t3 to the time t6, the potential Vin of the point A is suppressed to the Zener diode potential VZD1. Moreover, for a period from the tire t5 to the time t6, the potential VG2 of the point D is suppressed to the Zener diode potential VZD2.

At the time t6, when the potential of the high side power lame VBS, which is applied to the high side driver 11, stops rising, a current IZD that flows through the Zener diode ZD1 is extinguished substantially simultaneously. As a result, a current passes through a path extending along the high side power supply line VBS, the pull-up resistor R1, and the parasitic capacitor C1, a current passes through a path extending along the high side power supply line VBS, an ON resistor (source-drain) of the transistor Q2, and the parasitic capacitor C1 due to the transistor Q2 in the ON state, the capacitor C1 is charged by the current I1 as the sum of these two currents, and the potential Vin of the point A rises rapidly.

Simultaneously, at the time t6, when the potential of the high side power supply line VBS, which is applied to the high side driver 11, stops rising, the current IZD that flows through the Zener diode ZD2 is extinguished substantially simultaneously, and accordingly, the current I2 passes through the path extending along the high side power supply line VBS, the pull-up resistor R2, and the parasitic capacitor C2, and the potential VG2 of the point D starts to rise.

At a time t7, the potential Vin of the point A rises rapidly to reach the threshold voltage Vth of the signal level detection circuit 9 or more, and the output Vout of the signal level detection circuit 9 is switched from the "H" level to the "L" level.

For a period from the time t1 to the time t7, a mask time TM1 occurs, during which preparation for transmitting the next level shift signal to the VG1 is not made, that is, during which the signal transmission is not made.

At a time t8, the potential Vin of the point A rises rapidly to the potential VBS of the high side.

At a time t9, when the potential VS2 of the point D rises to the threshold voltage Vth of the transistor Q2 or more, the transistor Q2 is turned OFF, and turns to the open state.

At a time t10, the potential VG2 of the point D rises to the potential VBS.

At a time t11, when the high side drive signal drops from the "H" level to the "L" level, the edge detection circuit 15 detects the falling edge of the high side drive signal, and generates the level shift signal VG1 of the OFF pulse.

At this time, the N-type MOS transistor Q1 is switched from the OFF sate to the ON state, and the current I1 supplied from the high side power supply line VBS passing through the pull-up resistor R1 and the Zener diode ZD1 passes through a path extending along the drain of the transistor Q1, the source thereof, the source resistance RS1, and the GND. Then, the Vin potential of the point A is suppressed to the Zener diode potential VZD1 to drop down to the threshold voltage Vth of the signal level detection circuit 9 or less, and the output Vout of the inverter circuit 9 is switched from the "L" level to the "H" level.

For a period from the time t11 to a time t12, the N-type MOS transistor Q1 is in the ON state, and accordingly, the Vin potential of the point A is suppressed to the Zener diode potential VZD1.

For a period from the time t12 to a time t13, when the level shift signal VG1 is switched from the "H" level to the "L" level (t12), this N-type MOS transistor Q1 turns to the OFF state. Then, the current I1 passes through a path extending along the high side power supply line VBS, the pull-up resistor R1, and the parasitic capacitor C1, the C1 is charged, and the potential Vin of the point A gradually rises.

At the time t13, the high side power supply line VBS of the high side driver 11 starts to drop.

For a period from the time t13 to a time t14, a potential VFZD1 (0.6V) of the Zener diode ZD1 is applied to the Vin potential of the point A. Simultaneously, a potential VFZD2 (0.6V) of the Zener diode ZD2 is applied to a VG2 potential of the point D.

For a period from the time t14 to a time t15, the potentials of the point A and the point D are held at the above-described respective voltages.

At the time t15, the high side power supply line VBS drops to 0V, and accordingly, the floating potential Vss drops to approximately 0V. Simultaneously, the potential VFZD1 (0.6V) that has been generated on both ends of the Zener diode ZD1 is extinguished, and the Vin potential of the point A is reduced by the potential VFZD1. In a similar manner, the potential VFZD2 (0.6V) that has been generated on both ends of the Zener diode ZD2 is extinguished, and the VG2 potential of the point D is reduced by the potential VFZD2.

As described above, when the potential of the high side driver 11 stops rising (t6), substantially simultaneously, the current IZD that flows through the Zener diode ZD2 is extinguished, then the current passes through a path extending along the pull-up resistor R2 and the parasitic capacitor C2, the parasitic capacitor C2 is charged, and the drain voltage VG2 of the transistor Q3 is approximated to the power supply potential of the high side driver 11.

The time constant τR2 is determined by the values of the parasitic capacitor C2 and the pull-up resistor R2, and the value of the pull-up resistor R2 is set at a resistance value significantly lower than that of the pull-up resistor R1 and at a resistance value somewhat larger than a parallel resistance value of the pull-up resistor R1 and the ON resistance Ron of the transistor Q2.

As in the timing chart shown in FIG. 8, the relationship among the pull-up resistors R1 and R2, the ON resistance Ron and Vth of the Pr transistor Q2, and the parasitic capacitors C1 and C2 is set so that the transistor Q2 can be turned OFF at the timing (t7) when the potential Vin of the transistor Q1 at the point A reaches the threshold voltage Vth of the signal level detection circuit 9. Accordingly, preparation for making it possible to transmit the level shift signal of the transistor Q1 to the high side driver 11 is completed at this timing.

The level shift signal inputted to the transistor Q1 is subjected to I-V conversion by the pull-up resistor R1, becomes a voltage signal V, is inputted to the signal level detection circuit 9, is inverted by the inverter circuit 9, and is transmitted to the high side driver 11.

At this tire, the transistor Q2 is in the OFF state (t9 and after), and the pull-up resistor R1 is set to the relatively high resistance value, and accordingly, even a low current signal is converted into a sufficiently large voltage signal, thus making it possible to transmit the signal to the high side driver 11 surely by a signal pulse with a low current.

(Comparison with First Conventional Technology)

Figure 5:
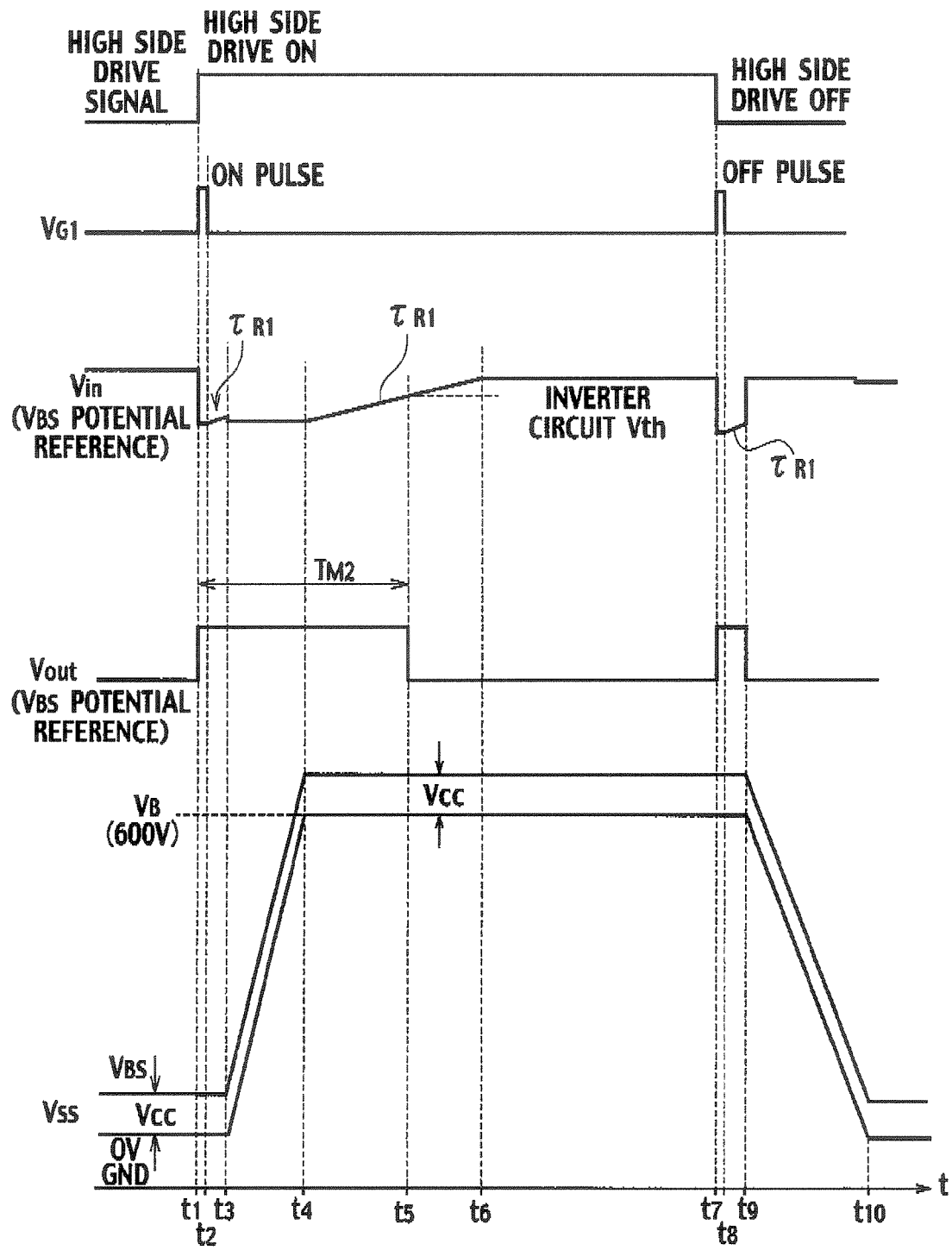
FIG. 5 is a timing chart for explaining a problem of the first conventional technology.

In the first conventional technology, as in the timing chart shown in FIG. 5, the mask time TM2 exits, which is decided in accordance with the time constant τR1 by the pull-up resistor R1 and the parasitic capacitor C1. Contrary to this, in this embodiment, as in the timing chart shown in FIG. 8, the ON resistance Ron of the transistor Q2 exists as the parallel resistance of the pull-up resistor R1, whereby the potential Vin is approximated to the high side power supply line VBS of the high side driver 11 in the significantly short mask time TM1.

In the timing chart shown in FIG. 5, the drain voltage Vin of the transistor Q1 is approximated to the power supply potential VBS of the high side driver 11 in the required period (t1 to t5).

Therefore, the required period is much shorter than the time constant τR1 generated by the pull-up resistor R1 and the parasitic capacitor C1 of the transistor Q1 in FIG. 1.

In the conventional level shift circuit 103 as shown in FIG. 1, large power is required in order to shorten the time from when the VBS applied to the high side driver 11 becomes the high potential to when the signal is sent. On the contrary, when the power consumption for the signal transmission is reduced, it becomes necessary to ensure a long time before sending the signal.

(Comparison with Second Conventional Technology)

Figure 3:
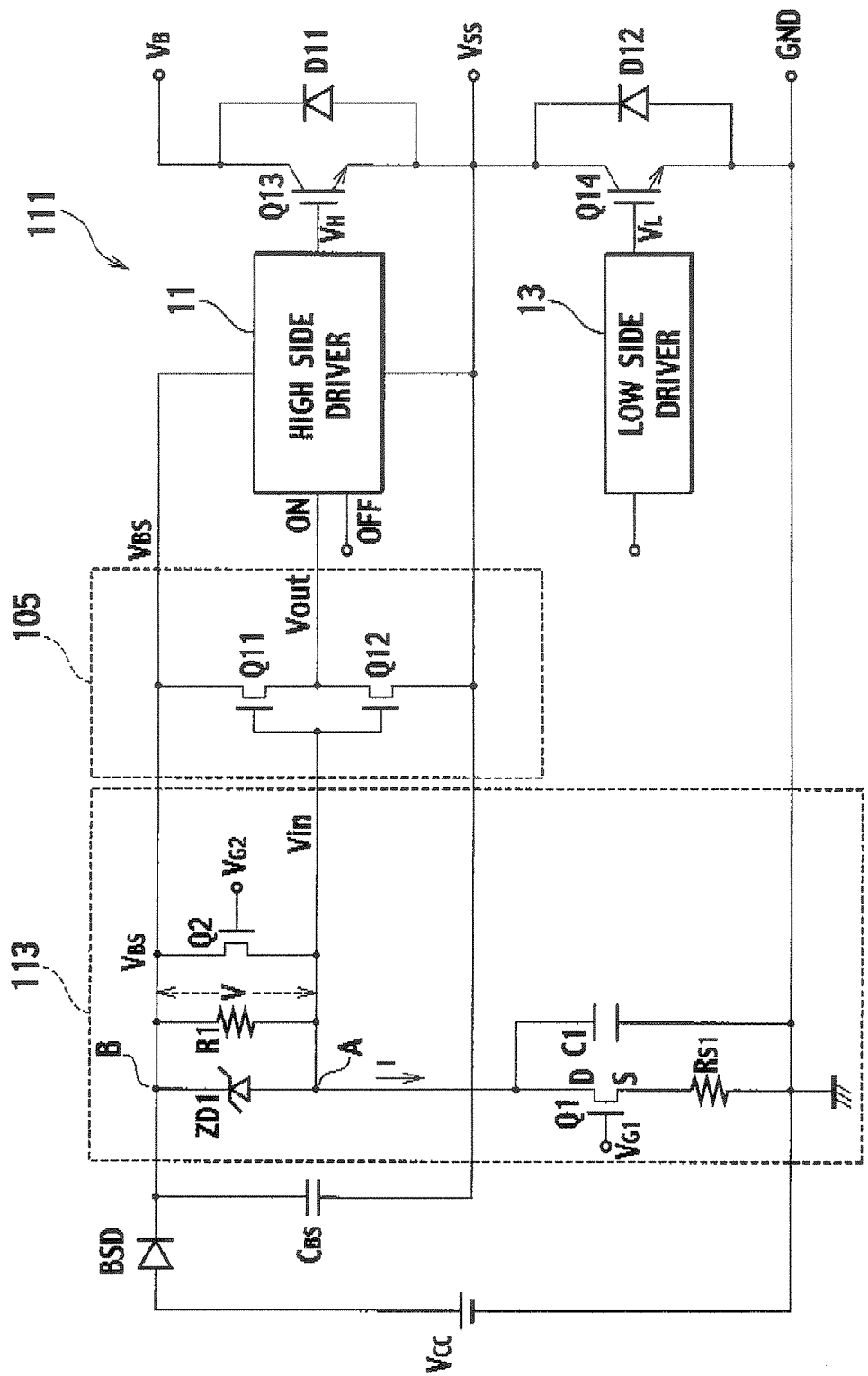
FIG. 3 is a diagram showing a half bridge drive circuit 111 as a second conventional technology.
Figure 4:
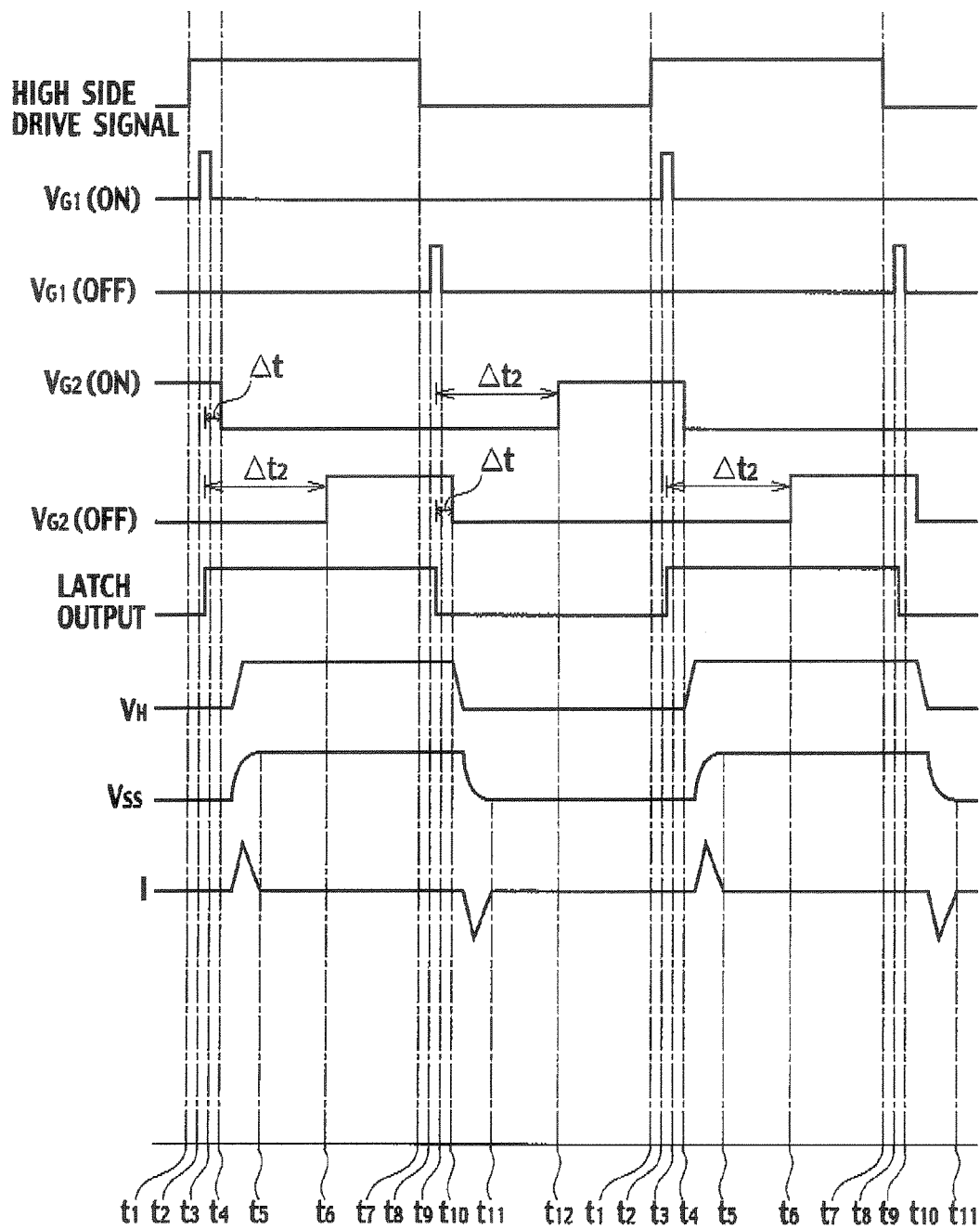
FIG. 4 is a timing chart for exclaiming an overall operation of the half bridge drive circuit 111 as the second conventional technology.

Moreover, in the conventional level shift circuit 113 as shown in FIG. 3, the time constant is not constant owing to the variations of the parasitic capacitor C1 and the ON resistance of the transistor Q2, and the like, and the timing for switching the control signal given to the gate of the transistor Q2 is not constant, and accordingly, a setting with an allowance must be made. Therefore, a large effect for shortening the time cannot be obtained.

Furthermore, large power is required in order to send the control signal inputted to the gate of the transistor Q2 from the low side as generally perform.

(Effect of This Embodiment)

When the transistor Q1 is turned ON/OFF, whereby a reference potential (Vss) of the floating power supply is changed, the level shift circuit 3 of this t suppresses the signal by conducting, through the transistor Q2, the current that flows through the capacitor element C2 so that the signal detection output of the signal level detection circuit 9, which is caused by the current that passes through the parasitic capacitor C1 placed between the main terminals of the transistor Q1, cannot be outputted as the signal. As results, the power consumption is suppressed, and the high-speed operation can be realized.

Moreover, under an actual operation situation changed by the load state and the control state, with regard to the rising speed of the high side driver 11, the C1 and the C2 having the same capacitance as the parasitic capacitor C1 are automatically charged in a short time from the point of time when the voltage change of the high side power supply line VBS of the high side driver 11 is stopped. Accordingly, high-speed signal transmission can be made possible. Moreover, simultaneously, lowering of the signal power of the level shift circuit can be realized by the low power of only the charge/discharge of the parasitic capacitors. It is noted that the parasitic capacitors C1 and C2 of the transistors Q1 and Q3 are composed of integrated circuits which are the same elements and can make a good pair, whereby a higher effect can be obtained.

As descried above, the level shift circuit and the power supply device, which are capable of suppressing the power consumption and realizing the high-speed operation by using the simple circuit configuration, can be provided.

Other Embodiments

The present invention is not limited to the above-described embodiment, and can be modified within the range without departing from the spirit thereof.

For example, though the parasitic capacitor C1 and the parasitic capacitor C2 are set at the same capacitance, the value of the capacitor element C2 may be reduced in such a manner that a circuit impedance is set high and the circuit current I2 is reduced. In this case, it becomes possible to reduce a space following the reduction of the capacitor element C2, and further to reduce the power consumption by the reduction of the circuit current.

MODIFICATION EXAMPLE 1

Figure 9:
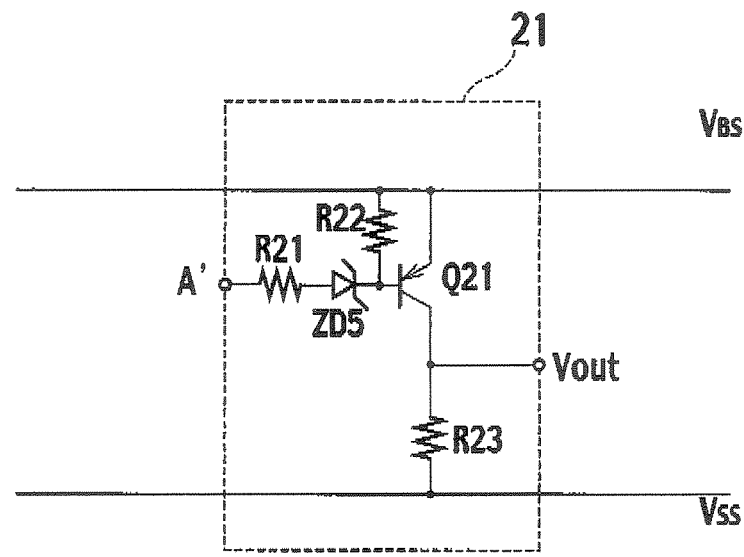
FIG. 9 is a circuit diagram of a signal level detection circuit 21 substitutable for a signal level detection circuit 9 shown in FIG. 6.

FIG. 9 is a circuit diagram of a signal level detection circuit 21 substitutable for the signal level detection circuit 9 shown in FIG. 6. The point A shown in FIG. 6 is connected to an point A' shown in FIG. 9, and is connected to an anode of a Zener diode ZD5 through a resistor R21, a cathode thereof is connected through a resistor R22 to the high side power supply line VBS, and this cathode is connected to a base of a transistor Q21. An emitter of this transistor Q21 is connected to the high side power supply line VBS, a collector of this transistor Q21 is connected through a resistor R23 to the floating potential Vss, and this collector terminal is connected as the output Vout to the high side driver 11.

MODIFICATION EXAMPLE 2

Figure 10:
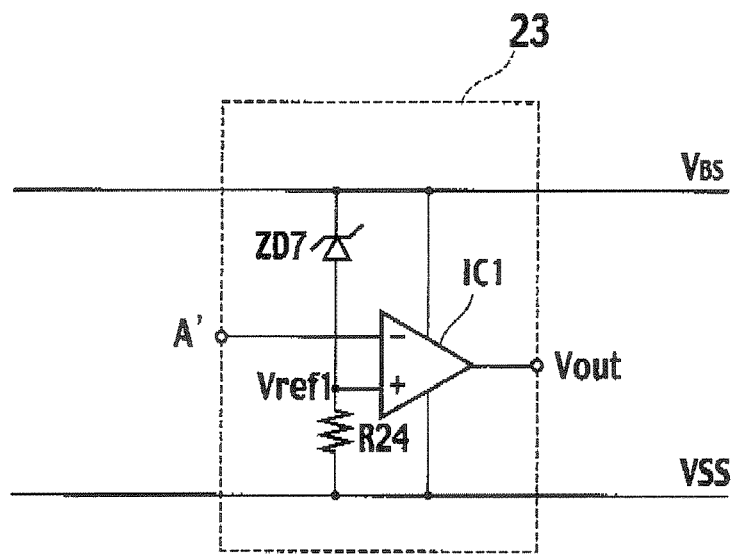
FIG. 10 is a circuit diagram of a signal level detection circuit 23 substitutable for the signal level detection circuit 9 shown in FIG. 6.

FIG. 10 is a circuit diagram of a signal level detection circuit 23 substitutable for the signal level detection circuit 9 shown in FIG. 6. The point A shown in FIG. 6 is connected to a point A' shown in FIG. 10, and this is directly connected to one input terminal of a comparator IC1. A positive terminal of the comparator IC1 is connected through a resistor R24 to the floating potential Vss, and is connected through a Zener diode Z7 to the high side power supply line VBS. A reference potential Vref1 is supplied to the positive input terminal of the comparator IC1. An output terminal of the comparator IC1 is connected as the output Vout to the high side driver 11.

MODIFICATION EXAMPLE 3

Figure 11:
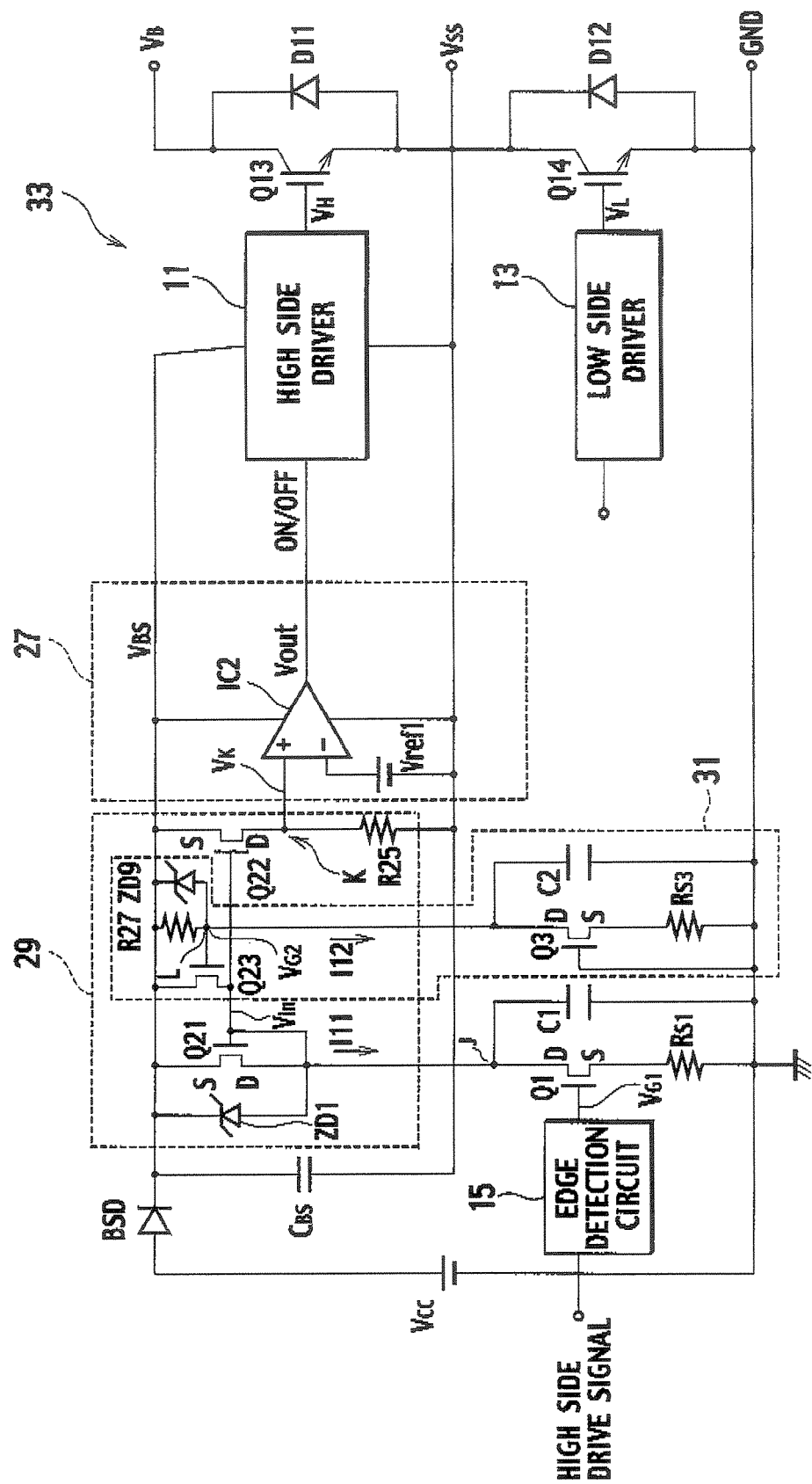
FIG. 11 is a diagram showing a drive circuit using a detection circuit according to a second embodiment of the present invention.

FIG. 11 is a diagram showing a drive circuit 33 in which the detection circuit (R1) of the level shift circuit of FIG. 6 is replaced by a detection circuit 29 composed of a current mirror circuit formed of transistors Q21 and Q22. By employing the current mirror, the signal voltage of the level shift circuit, which is generated in the R1 by taking as a reference the VBS potential of the floating power supply in the embodiment of FIG. 6, can be replaced by a signal voltage generated in an R25 by taking as a reference the VSS potential of the floating power supply. As shown in FIG. 11, a transistor Q23 is connected between the VBS end on one side of the floating power supply and a control terminal of the transistor Q21. Between the control terminal of the transistor Q23 and the VBS terminal on one side of the floating power supply, a pull-up resistor R27 is connected, and a Zener diode ZD9 that composes the voltage suppression element is connected in parallel thereto. Moreover, the transistor Q3 is connected between the control terminal of the transistor Q23 and the ground. This transistor Q3 allows the gate terminal thereof to be connected to the GND, whereby the capacitor element that performs the OFF control for this transistor and functions equivalently to the capacitor C2 is formed. The capacitor C1 is nearly equal to the capacitor C2.

A description will be made of an operation of an emphasis circuit 31 shown in FIG. 11. When the floating potential Vss rises, and the current passes through the capacitor C1, the current flows through the capacitor C2 in a similar manner, and the transistor Q23 is conducted between a drain and source. The operation becomes similar to that of the first embodiment except that the time constant τR3 is a time constant according to an ON resistance between a drain and source of the transistor Q21, an ON resistance between the drain and source of the transistor Q23, and the capacitor C1.

In this embodiment, by using the current mirror for the detection circuit, the signal voltage generated in the resistor R1 by taking as a reference the VBS of the floating power supply is generated by the resistor R25 by taking as a reference the VSS end of the floating power supply, and the generated signal voltage can be matched with those of a signal level detection circuit 27 and the high side driver 11. Other operations are similar to the embodiment of FIG. 6, and accordingly, a detailed description of the operations will he omitted.

MODIFICATION EXAMPLE 4

Figure 12:
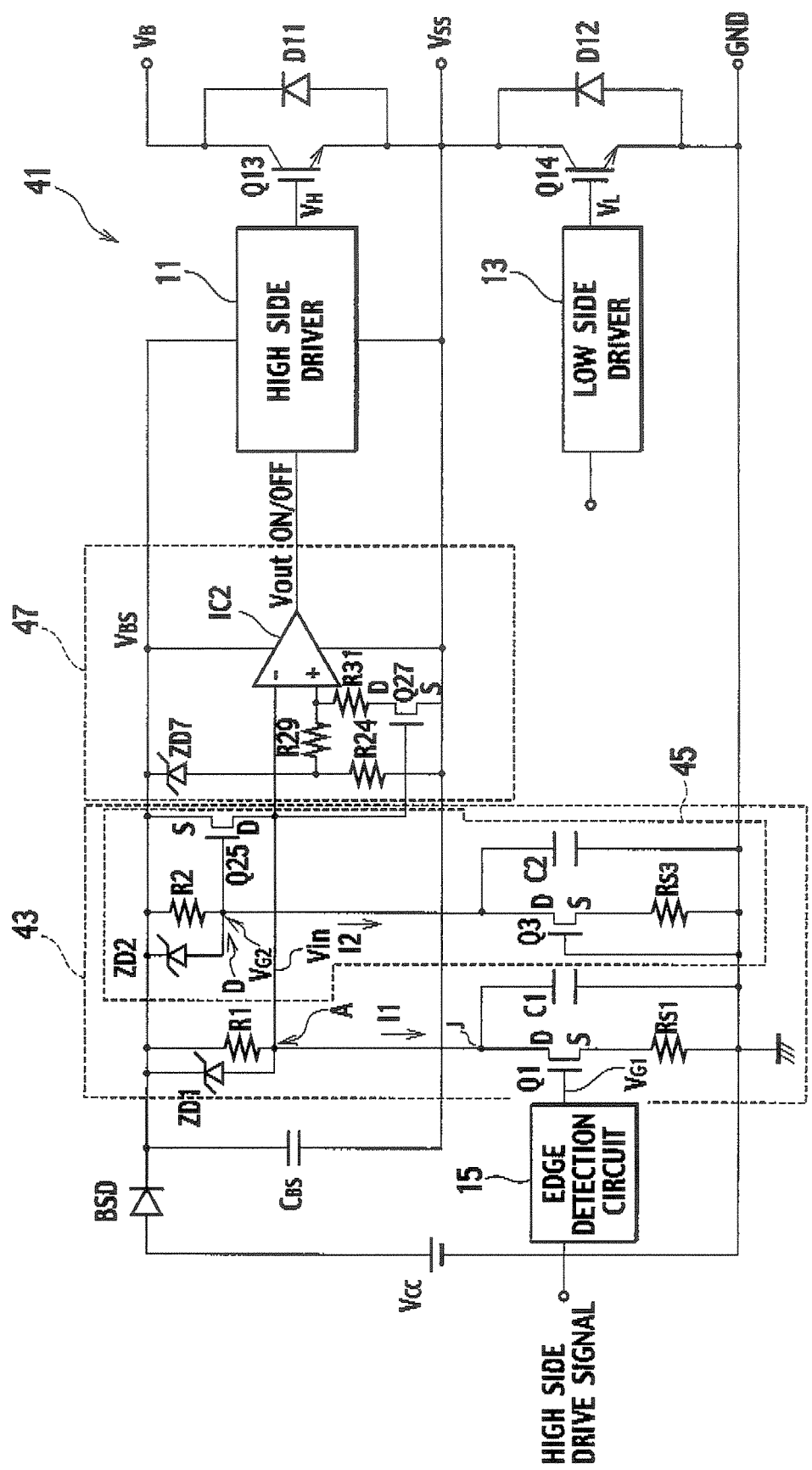
FIG. 12 is a diagram showing a drive circuit using a level shift circuit according to a third embodiment of the present invention.

FIG. 12 is an example where a malfunction signal from the signal level detection circuit Vout is more surely prevented from being outputted in such a manner that the reference voltage is changed by a voltage dividing circuit of a transistor Q27 and resistors 29 and 31 as well as the time constant is changed by the control element transistor Q2 of the level shift circuit 3 shown in FIG. 6. As shown in FIG. 12, between the VBS end on one side of the floating power supply and the drain of the transistor Q1, the pull-up resistor R1 is connected, and the potential Vin of the point A of the resistor R1 is inputted to a negative input terminal of a comparator IC2. Between a control terminal of the transistor Q25 and the VBS terminal on one side of the floating power supply, the pull-up resistor R2 is connected, and the Zener diode ZD2 that works as the voltage suppression element is connected m parallel thereto. Moreover, the transistor Q3 is connected between the control terminal of the transistor 25 and the ground. This transistor Q3 allows the gate terminal thereof to be connected to the GND, whereby the capacitor element generated by the OFF control of this transistor and functioning equivalently to the capacitor C2 is formed. The capacitor C1 is nearly equal to the capacitor C2.

Meanwhile, a source of the transistor Q25 is connected to the floating power supply VBS, and a drain of the transistor 25 is connected to a gate of the transistor Q27 of a signal level detection circuit 47.

The connection point A between the pull-up resistor R1 and the transistor Q1 in the level shift circuit 43 is connected to the negative input terminal of the comparator IC2 that copses the signal level detection circuit 47. The floating power supply VBS is connected to a cathode of a Zener diode ZD7, an anode thereof is connected through the R24 to the Vss side of the floating power supply, and a connection point between this anode and the resistor R24 is set as the reference voltage, and is connected through a resistor R29 to a positive input terminal of the comparator IC2. Moreover, a drain of the transistor Q27 is connected through an R31 to the positive input terminal of the comparator IC2, and a source thereof is connected to the Vss side of the floating power supply. An output terminal of the comparator IC2 is connected as the output Vout to the high side driver 11.

A description will be made of operations of the emphasis circuit 45 and the signal level detection circuit 47, which are shown in FIG. 12. When the floating potential Vss rises, and the current passes through the capacitor C1, the current flows also through the capacitor C2 in a similar manner, and the transistor Q25 connected to the floating power supply VBS is turned ON, and the transistor Q27 is turned ON. In such a way, the positive input terminal of the comparator IC2 has a potential more approximate to the floating potential Vss than usual, and such a comparison reference value is increased relatively. Therefore, the comparator IC2 comes not to perform the output even if the current passes through the capacitor C1. Other operations are similar to the embodiment of FIG. 6, and accordingly, a detailed description of the operations will be omitted.

Effect of the Invention

According to the present invention, when the first switching element (Q1) is turned ON/OFF, whereby the reference potential (Vss) of the floating power supply is changed, in order to minimize the mask time TM2 during which the signal transmission by the current that passes through the parasitic capacitor (C1) placed between the main terminals of the first switching element (Q1) is not made, the current passing through the second capacitor element (C2) is conducted through the second switching elements (Q2, Q23, Q25), and the time constant resulting from the parasitic capacitor (C1)

and the signal detection circuit is changed, whereby the power consumption can be suppressed, and the high-speed operation can he realized.

According to another aspect of the present invention, the second capacitor (C2) is the parasitic capacitor (C2) of the third transistor m which the pair of main terminals are connected between the control terminal of the second switching element and the ground, whereby the charging voltage corresponding to the charge to this parasitic capacitor is given to the control terminal of the second switching element, and the ON control is performed. In such a way, the high-speed operation can be realized.

According to still another aspect of the present invention, the second capacitor (C2) is the parasitic capacitor of the rectifier element, in which the pair of main terminals are connected between the control terminal of the second switching element and the ground, whereby the charging voltage corresponding to the charge to this parasitic capacitor is given to the control terminal of the second switching element, and the ON control is performed. In such a way, the high-speed operation can be realized.

According to still another aspect of the present invention, the resistor element (R2) is connected between the control terminal of the second switching element (Q2) and one of the terminals of the floating power supplies (BSD, CBS), whereby the voltage sullied from the floating power supplies is given to the control terminal of the second transistor, and the ON control is performed. In such a way, the high-speed operation can be realized.

According to still another aspect of the present invention, the voltage suppression elements (ZD1, ZD2) are connected between the floating power supplies (BSD, CBS) and the signal level detection circuit input terminal or/and the control terminal of the second switching element (Q2), whereby the ON control time of the control terminal of the second transistor can be made constant, the power consumption can be suppressed, and the high-speed operation can be realized.

According to still another aspect of the present invention, there can be provided the power supply device including the high side driver for driving the high side transistor and the low side driver for driving the low side transistor, in which the power consumption can be suppressed and the high-speed operation can be realized by using the level shift circuit as the circuit for inputting the control signal to the high side driver.

INDUSTRIAL APPLICABILITY

The present invention is usable for the level shift circuit or the power supply device using the same.

(U.S. Designation)

This application claims benefit of priority under 35USC §119 to Japanese Patent Application No. 2005-084132, filed on Mar. 23, 2005, the entire contents of which are incorporated by reference herein.

The invention claimed is:

1. A level shift circuit, comprising:
a floating power supply;
a signal detection circuit connected to one end of the floating power supply;
a signal level detection circuit connected between electrodes of the floating power supply and connected to an output of the signal detection circuit; and
a first switching element configured to perform level shift, a pair of main terminals thereof being individually connected between an input terminal of the signal detection circuit and a ground, wherein:
a second switching element is connected to the signal detection circuit or the signal level detection circuit; and
a second capacitor element defines a time constant corresponding to a time constant being defined based on a parasitic capacitor existing between the main terminals of the first switching element and is connected to a control terminal of the second switching element.

2. The level shift circuit according to claim 1, wherein when a current passes through the second capacitor element, the second switching element switches the time constant, that is defined based on the parasitic capacitor existing between the main terminals of the first switching element and on the signal detection circuit, to a smaller time constant.

3. The level shift circuit according to claim 1, wherein the second capacitor is a parasitic capacitor existing at a third transistor in which a pair of main terminals thereof are connected between the control terminal of the second switching element and the ground.

4. The level shift circuit according to claim 2, wherein the second capacitor is a parasitic capacitor existing at a third transistor in which a pair of main terminals thereof are connected between the control terminal of the second switching element and the ground.

5. The level shift circuit according to claim 1, wherein the second capacitor is a parasitic capacitor existing at a rectifier element in which a pair of main terminals thereof are connected between the control terminal of the second switching element and the ground.

6. The level shift circuit according to clam 2 wherein the second capacitor is a parasitic capacitor existing at a rectifier element in which a pair of main terminals thereof are connected between the control terminal of the second switching element and the ground.

7. The level shift circuit according to claim 1, wherein a resistance element is connected between the control terminal of the second switching element and one terminal of the floating power supply.

8. The level shift circuit according to claim 2, wherein a resistance element is connected between the control terminal of the second switching element and one terminal of the floating power supply.

9. The level shift circuit according to claim 1, wherein a voltage suppression element is connected between the floating power supply and an input terminal of the signal level detection circuit or/and the control terminal of the second switching element.

10. A power supply device including a high side driver for driving a high side transistor, and a low side driver for driving a low side driver,
wherein the level shift circuit according to claim 1 is employed as a circuit for inputting a control signal to the high side driver.

11. A power supply device including a high side driver for driving a high side transistor, and a low side driver for driving a low side driver,
wherein the level shift circuit according to claim 2 is employed as a circuit for inputting a control signal to the high side driver.

* * * * *